United States Patent [19]

Lee et al.

[11] Patent Number: 5,790,579
[45] Date of Patent: Aug. 4, 1998

[54] SEMICONDUCTOR LASER DEVICE FOR PULSE LASER OSCILLATION

[75] Inventors: Kyu-Seok Lee; Joon-Tae Ahn; El-Hang Lee, all of Daejeon, Rep. of Korea

[73] Assignee: Electronics and Telecommunications Research Institute, Daejeon, Rep. of Korea

[21] Appl. No.: 708,686

[22] Filed: Sep. 5, 1996

[30] Foreign Application Priority Data

Dec. 22, 1995 [KR] Rep. of Korea ............... 1995 54541

[51] Int. Cl.$^6$ .................................................. H01S 3/10
[52] U.S. Cl. ............................ 372/45; 372/96; 372/50
[58] Field of Search .............................. 372/45, 46, 50, 372/96

[56] References Cited

U.S. PATENT DOCUMENTS

| | | | |
|---|---|---|---|
| 5,497,393 | 3/1996 | Lee | 372/96 |
| 5,581,572 | 12/1996 | Delorme et al. | 372/96 |
| 5,636,236 | 6/1997 | Tada et al. | 372/45 |
| 5,640,409 | 6/1997 | Ito et al. | 372/45 |
| 5,659,562 | 8/1997 | Hisa | 372/96 |

*Primary Examiner*—Rodney B. Bovernick
*Assistant Examiner*—Yisun Song
*Attorney, Agent, or Firm*—Nixon & Vanderhye P.C.

[57] ABSTRACT

A pulsed semiconductor laser has a lower threshold current and a more stable pulse train. The structure includes a saturable absorber section has a quantum well structure for laser oscillation, a gain section, a phase control section, and a super structure grating-distributed Bragg reflector section. It uses an improved construction for overcoming problems of conventional pulsed semiconductor lasers. The improved structure includes five quantum well layers having thicknesses with respective spontaneous emission peak wavelengths of "$\lambda-2\delta$", "$\lambda+\delta$", "$\lambda+2\delta$", "$\lambda$", "$\lambda-\delta$" at room temperature from their upper section. $\lambda$ denotes the mean wavelength of the oscillating pulse laser, and $\delta$ denotes a fixed value less than 12 nm. The super structure grating-distributed Bragg reflector section has five sampling sections, with each section having five kinds of different pitches arranged in order of thicknesses of 25 cycles, 5 cycles, 25 cycles, 5 cycles, and 25 cycles.

6 Claims, 2 Drawing Sheets

| | |
|---|---|
| P+CAP LAYER | ~33 |
| P CLADDING LAYER | ~32 |
| i BARRIER LAYER | ~31 |
| i QUANTUM WELL LAYER(PEAK WAVELENGTH=$\lambda-2\delta$) | ~29 |
| i BARRIER LAYER | ~28 |
| i QUANTUM WELL LAYER(PEAK WAVELENGTH=$\lambda+\delta$) | ~27 |
| i BARRIER LAYER | ~26 |
| i QUANTUM WELL LAYER(PEAK WAVELENGTH=$\lambda+2\delta$) | ~25 |
| i BARRIER LAYER | ~24 |
| i QUANTUM WELL LAYER(PEAK WAVELENGTH=$\lambda$) | ~23 |
| i BARRIER LAYER | ~22 |
| i QUANTUM WELL LAYER(PEAK WAVELENGTH=$\lambda-\delta$) | ~21 |
| i BARRIER LAYER | ~14 |
| n CLADDING LAYER | ~13 |
| n+BUFFER LAYER | ~12 |
| n+(or SI)SUBSTRATE | ~11 |

(Layers 21–29 are bracketed as group 20.)

SEMICONDUCTOR LASER DEVICE FOR PULSE LASER OSCILLATION

BACKGROUND OF THE INVENTION

1. Field of the Invention

The present invention relates to a semiconductor laser device for pulsed laser oscillation which includes a semiconductor quantum well generating a pulse train having a predetermined repetition rate ranging from a few hundreds of Giga Hz to or a few Tera Hz.

2. Description of the Conventional Art

Recently, a semiconductor laser device having an integrated cavity construction provided with a saturable absorber section, a gain section, a phase control section, a distributed Bragg reflector section, and the like has been developed so as to generate a stable pulse train having a high repetition rate from a pulsed semiconductor laser device which is adapted to serve as a light source in an optical communication system or an optical memory device.

When a current higher than a threshold oscillation current is applied to the above-mentioned laser construction, a pulse train is produced in accordance with harmonic passive mode locking.

The major mechanism which enables harmonic passive mode locking is based on oscillation in accordance with a phenomenon wherein a reflection rate of a distributed Bragg reflector (DBR) of a finite length oscillates near the main oscillation wavelength.

The DBR construction of the semiconductor quantum well laser device which has been developed so far for pulsed laser oscillation uses a diffraction plate arranged at a predetermined regular interval and multiple quantum wells having uniform thickness for laser oscillation at a single wavelength.

Since the above-mentioned construction has a narrow gain wavelength region, it has the disadvantage of increasing the threshold oscillation current when oscillating as a pulsed laser in harmonic passive mode locking.

SUMMARY OF THE INVENTION

Accordingly, it is an object of the present invention to provide an improved semiconductor laser for pulsed laser oscillation which overcomes the problems encountered in the conventional semiconductor laser device.

It is another object of the present invention to provide a semiconductor laser for pulsed laser oscillation which has a lower threshold current and a more stable pulse characteristic by using an improved construction designed for overcoming the problems of a conventional pulse semiconductor laser device construction.

To achieve the above objects, in accordance with one aspect of the present invention, there is provided a semiconductor laser for pulsed laser oscillation, which includes five quantum well layers having respective thicknesses each spontaneous emission peak wavelengths of "$\lambda-2\delta$", "$\lambda+\delta$", "$\lambda+2\delta$", "$\lambda$", "$\lambda-\delta$" at room temperature from their upper sections. The super structure grating-distributed Bragg reflector section has five sampling sections, with each section having five kinds of different pitches arranged in order of thicknesses of 25 cycles, 5 cycles, 25 cycles, 5 cycles, and 25 cycles. $\lambda$ denotes the mean wavelength of the oscillating pulsed laser and $\delta$ denotes a fixed value less than 12 nm. The semiconductor laser device includes a saturable absorber section having a quantum well structure for a laser oscillation, a gain section, a phase control section, and a super structure grating-distributed Bragg reflector section.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limiting with respect to the present invention, and wherein.

DETAILED DESCRIPTION OF THE INVENTION

The first embodiment of the present invention will now be explained with reference to the accompanying drawings.

Figure 1:
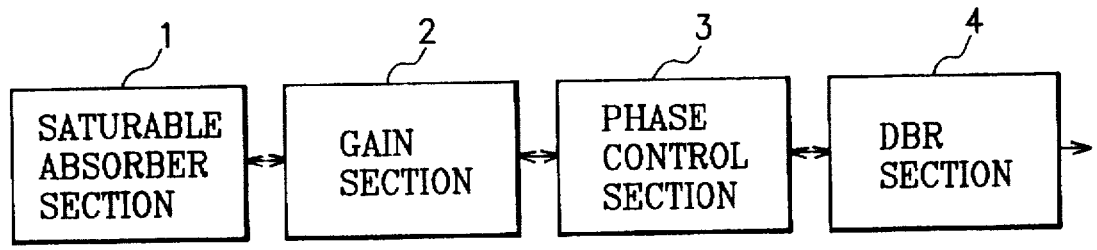
FIG. 1 is a block diagram showing a pulse semiconductor laser device according to the present invention.

FIG. 1 shows a block diagram of a pulsed semiconductor laser device according to the present invention.

In the drawings, reference numeral 1 denotes a saturable absorber section, reference numeral 2 denotes a gain section, reference numeral 3 denotes a phase control section, and reference numeral 4 denotes a super structure-grating distributed Bragg reflector.

The saturable absorber section 1 and the gain section 2 each has a quantum well structure as an active region, and the phase control section 3 and the super structure-grating distributed Bragg reflector 4 are referred to as a passive doped section.

In addition, the facet of the saturable absorber section 1 is coated for full reflection, so that colliding pulse mode-locking due to the collision itself is activated. The facet of the super structure-grating distributed Bragg reflector 4 is left is a cleaved state and is not coated for thus forming a laser outlet and a cavity therein.

Using the above-mentioned structure, so as to oscillate a desired pulsed laser, a reverse bias voltage is supplied to the saturable absorber section 1, and a forward bias voltage is supplied to the gain section 2.

Here, when applying a low current to the gain section 2, the pulsed laser having a repetition rate which is determined by based on the length of the laser cavity is oscillated as a passive mode locking mechanism.

Meanwhile, when increasing the forward bias voltage supplied to the gain section 2, since harmonic passive mode locking having a basic repeating rate of $c\delta/\lambda^2$ is formed, it is possible to observe the pulsed laser train having a harmonic repetition rate corresponding to double the basic repetition rate in accordance with the increased bias current of the gain section.

Figure 2:
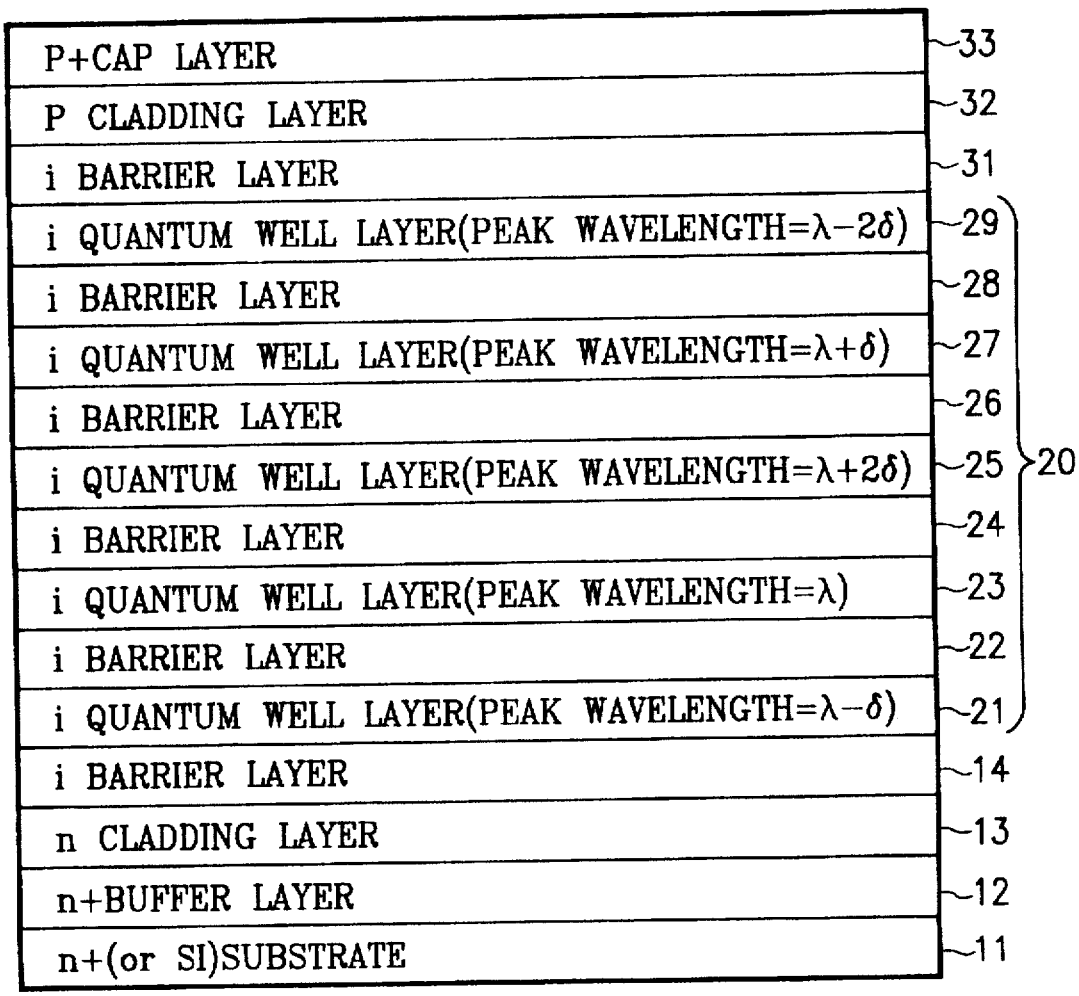
FIG. 2 is a view showing the construction of multiple quantum wells of a gain section according to the present invention.

FIG. 2 is a view showing the construction of multiple quantum wells of a gain section according to the present invention.

In the drawings, reference character "p" denotes p-doping, reference character "n" denotes n-doping, and reference character "+" denotes a heavily doped layer.

As shown therein, in the structure of the gain section 2, an n+(or semi-insulating) substrate 11, an n+ buffer layer 12, an n-cladding layer, an i-barrier layer 14, a multiple quantum well layer 20, an i-barrier layer 31, a p-cladding layer 32, and a p+ cap layer are formed thereon in order.

Here, the multiple quantum well layer 20 includes i-barrier layers between quantum well layers. In more detail, it includes an i-quantum layer 21 (having a spontaneous emission peak wavelength=$\lambda-\delta$), an i-barrier layer 22, an i-quantum well layer 23 (having a spontaneous emission peak wavelength=$\lambda$), an i-barrier layer 24, an i-quantum well layer 25 (having a spontaneous emission peak wavelength=$\lambda+2\delta$), an i-barrier layer 26, an i-quantum well layer 27 (having a spontaneous emission peak wavelength=$\lambda+\delta$), an i-barrier layer 28, and an i-quantum well layer 29 (having a spontaneous emission peak wavelength=$\lambda-2\delta$).

The number of the quantum well layers in the gain section is 5 (of which, each is referred to reference numerals 21, 23, 25, 27, and 29), and the thicknesses of each quantum well layer is chosen to produce respective spontaneous emission peak wavelengths at room temperature (from the upper side or the lower side) of "$\lambda-2\delta$", "$\lambda+\delta$", "$\lambda+2\delta$", "$\lambda$", and "$\lambda-\delta$", where $\lambda$ denotes the mean wavelength of the oscillating pulse laser, and $\delta$ denotes a fixed value less than 12 nm.

Figure 3:
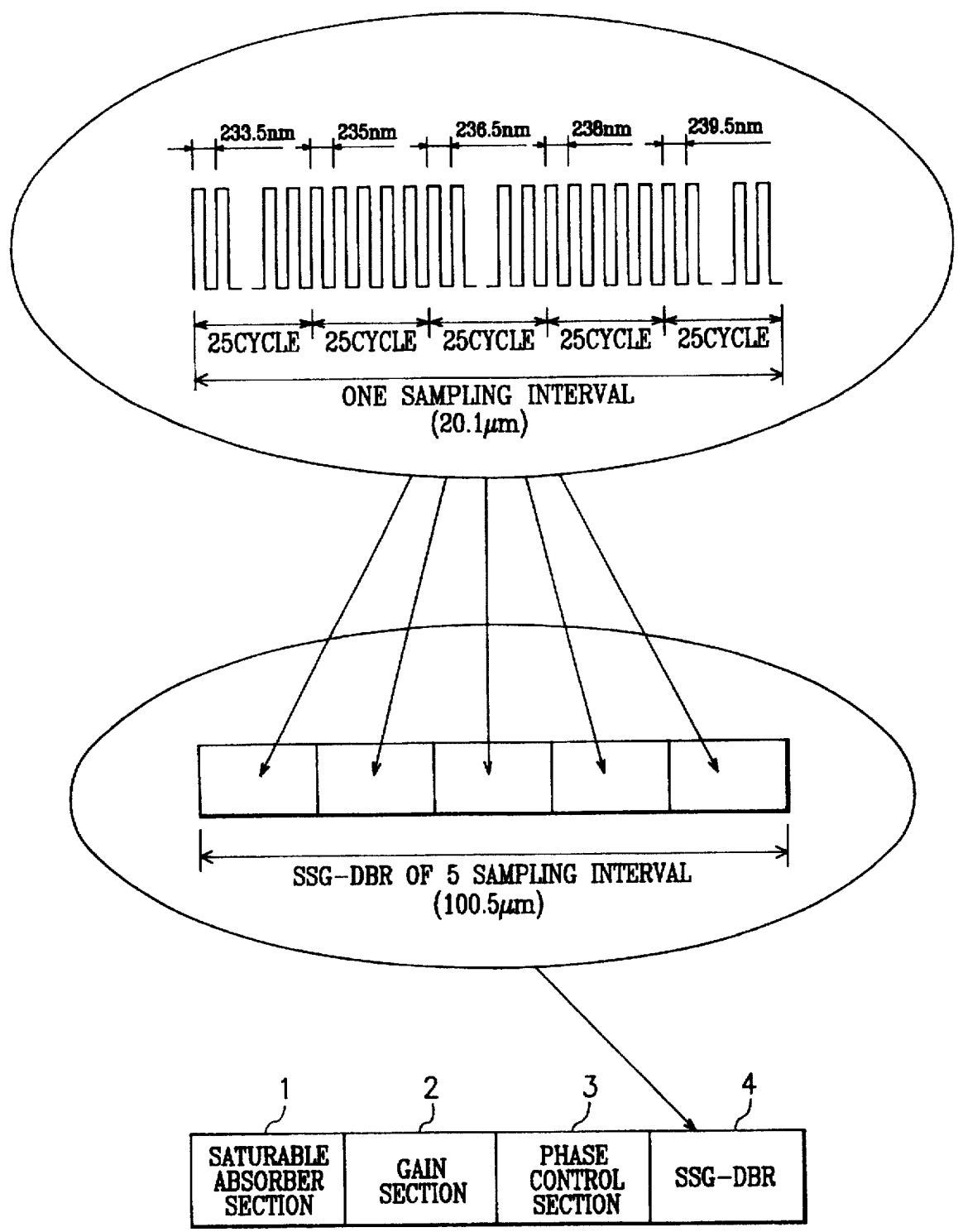
FIG. 3 is a view showing a super structure grating-distributed Bragg reflector section (SSG-DBR) according to the present invention.

FIG. 3 is a view showing a super structure grating-distributed Bragg reflector section (SSG-DBR) according to the present invention.

The SSG-DBR section comprises five sampling sections (the total length is 100.5 um). On the assumption that the effective phase refractive coefficient in the SSG-DBR is "n", each sampling interval (20.1 um) is referred to "$(\lambda-2\delta)2n$", "$(\lambda-\delta)/2n$", "$\lambda/2n$", "$(\lambda+\delta)/2n$", and "$(\lambda+2\delta)/2n$". Namely, five different refractive pitches (for example, 233.5 nm, 235 nm, 236.5 nm, 238 nm, and 239.5 nm) are arranged in order, with each having a thickness of 25 cycles, 5 cycles, 25 cycles, 5 cycles and 25 cycles.

Therefore, the width of each sampling interval is referred to $85\lambda/2n$, and the total length of five SSG-DBR sampling interval is $425\lambda/2n$.

In the above-described pulsed laser structure, the number of quantum well layers in the gain section of the laser structure according to the present invention is the same as the number of the refractive pitches of the SSG-DBR section. Since the wavelength $\lambda$ is directed to maximizing the gain rate of the laser waves which are well separated at about $\delta$ intervals within the $4\delta$ wavelength region, the threshold current for the pulsed laser oscillation is advantageously decreased. In addition, it is possible to generate harmonic passive mode locking having a predetermined repetition rate corresponding to an integer times the basic repetition rate of the expression "$c\delta/\lambda^2$"(where "c" denotes the speed of the light), and it is possible to oscillate the pulse train of the mean output higher than that of the earlier structures having the multiple quantum well layer with a mean thickness and the DBR structure.

As described above, the semiconductor laser device for a pulsed laser oscillation according to the present invention is directed to achieving the desired effect of producing a more stable pulse train from a few Tera Hz of repetition, whereby it may be used for a source of light in an optical memory device or a high speed optical communication system.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. In a semiconductor laser device for use as a pulsed laser comprising a saturable absorber section having a quantum well structure for a laser oscillation, a gain section, a phase control section of a passive doped section and a super structure grating-distributed Bragg reflector section, the improvements comprising:

five quantum well layers having thicknesses respectively producing spontaneous emission peak wavelengths of "$\lambda-2\delta$", "$\lambda+\delta$", "$\lambda+2\delta$", "$\lambda$", "$\lambda-\delta$" at room temperature, where $\lambda$ denotes the mean wavelength of the oscillating pulsed laser and $\delta$ denotes a fixed wavelength increment of less than 12 nm, and the super structure grating-distributed Bragg reflector section having five sampling sections, with each section having five kinds of different pitches arranged in order of thicknesses of 25 cycles, 5 cycles, 25 cycles, 5 cycles, and 25 cycles.

2. A semiconductor laser device as in claim 1 wherein:

intervals of each respective grating pitch are "$(\lambda-2\delta)/2n$", "$(\lambda-\delta)/2n$", "$\lambda/2n$", "$(\lambda+\delta)/2n$", and "$(\lambda+2\delta)/2n$", where "n" denotes the effective phase refractive coefficient of the super structure grating-distributed Bragg reflector section.

3. A semiconductor laser device as in claim 1 wherein:

the number of the quantum well layers of the gain section is the same as the number of different refraction pitches of the super structure grating-distributed Bragg reflector section.

4. In a semiconductor laser device for pulsed laser oscillation comprising a saturable absorber section having a quantum well structure for laser oscillation, a gain section, a phase arrangement section of a passive doped section and a super structure grating-distributed Bragg reflector section, the improvements comprising:

five quantum well layers having thicknesses respectively producing spontaneous emission peak wavelengths of "$\lambda-2\delta$", "$\lambda+\delta$", "$\lambda+2\delta$", "$\lambda$", "$\lambda-\delta$" at room temperature where $\lambda$ denotes the mean wavelength of the oscillating pulsed laser and $\delta$ denotes a fixed wavelength increment of less than 12 nm, and the super structure grating-distributed Bragg reflector section having five sampling sections, with each section having five kinds of different pitches arranged in order of thicknesses of 25 cycles, 5 cycles, 25 cycles, 5 cycles, and 25 cycles.

5. A semiconductor laser device as in claim 4 wherein:

intervals of each respective grating pitch are "$(\lambda-2\delta)/2n$", "$(\lambda-\delta)/2n$", "$\lambda/2n$", "$(\lambda+\delta)/2n$", and "$(\lambda+2\delta)/2n$", where "n" denotes the effective phase refractive coefficient of the super structure grating-distributed Bragg reflector section.

6. A semiconductor laser device as in claim 4 wherein:

the number of the quantum well layers of the gain section is the same as the number of different refraction pitches of the super structure grating-distributed Bragg reflector section.

* * * * *